United States Patent
Koshimizu et al.

(10) Patent No.: US 8,178,444 B2
(45) Date of Patent: May 15, 2012

(54) SUBSTRATE PROCESSING METHOD AND SUBSTRATE PROCESSING APPARATUS

(75) Inventors: Chishio Koshimizu, Nirasaki (JP); Taichi Hirano, Nirasaki (JP); Masanobu Honda, Nirasaki (JP); Shinji Himori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 564 days.

(21) Appl. No.: 12/363,992

(22) Filed: Feb. 2, 2009

(65) Prior Publication Data

US 2009/0197423 A1 Aug. 6, 2009

Related U.S. Application Data

(60) Provisional application No. 61/048,235, filed on Apr. 28, 2008.

(30) Foreign Application Priority Data

Feb. 6, 2008 (JP) .................. 2008-026371

(51) Int. Cl.
*H01L 21/311* (2006.01)
*H01L 21/302* (2006.01)

(52) U.S. Cl. ........ 438/719; 118/110; 118/715; 118/719; 156/345.31; 156/345.48; 156/345.51; 438/724; 438/758

(58) Field of Classification Search .............. 438/9, 719; 156/345.53, 345.33, 345.48; 219/390, 545, 219/444.1; 361/234; 73/204.26; 250/338.1
See application file for complete search history.

(56) References Cited

U.S. PATENT DOCUMENTS

| | | | | |
|---|---|---|---|---|
| 5,865,896 | A | * | 2/1999 | Nowak et al. ............... 118/723 I |
| 2004/0081439 | A1 | * | 4/2004 | Kholodenko et al. ........ 392/416 |
| 2006/0019031 | A1 | * | 1/2006 | Furuta et al. ............... 427/248.1 |
| 2007/0256787 | A1 | * | 11/2007 | Chandrachood et al. ........................ 156/345.48 |

FOREIGN PATENT DOCUMENTS

JP  2001-298015  10/2001

* cited by examiner

*Primary Examiner* — Duy Deo
*Assistant Examiner* — Erin Flanagan
(74) *Attorney, Agent, or Firm* — Oblon, Spivak, McClelland, Maier & Neustadt, L.L.P.

(57) ABSTRACT

A substrate processing method that can eliminate unevenness in the distribution of plasma. The method is for a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, and carries out plasma processing on the substrate. In the plasma processing, the temperature of the electrode plate is measured, and based on the measured temperature, the temperature of the electrode plate is maintained lower than a critical temperature at which the specific resistance value of the silicon starts changing.

13 Claims, 7 Drawing Sheets

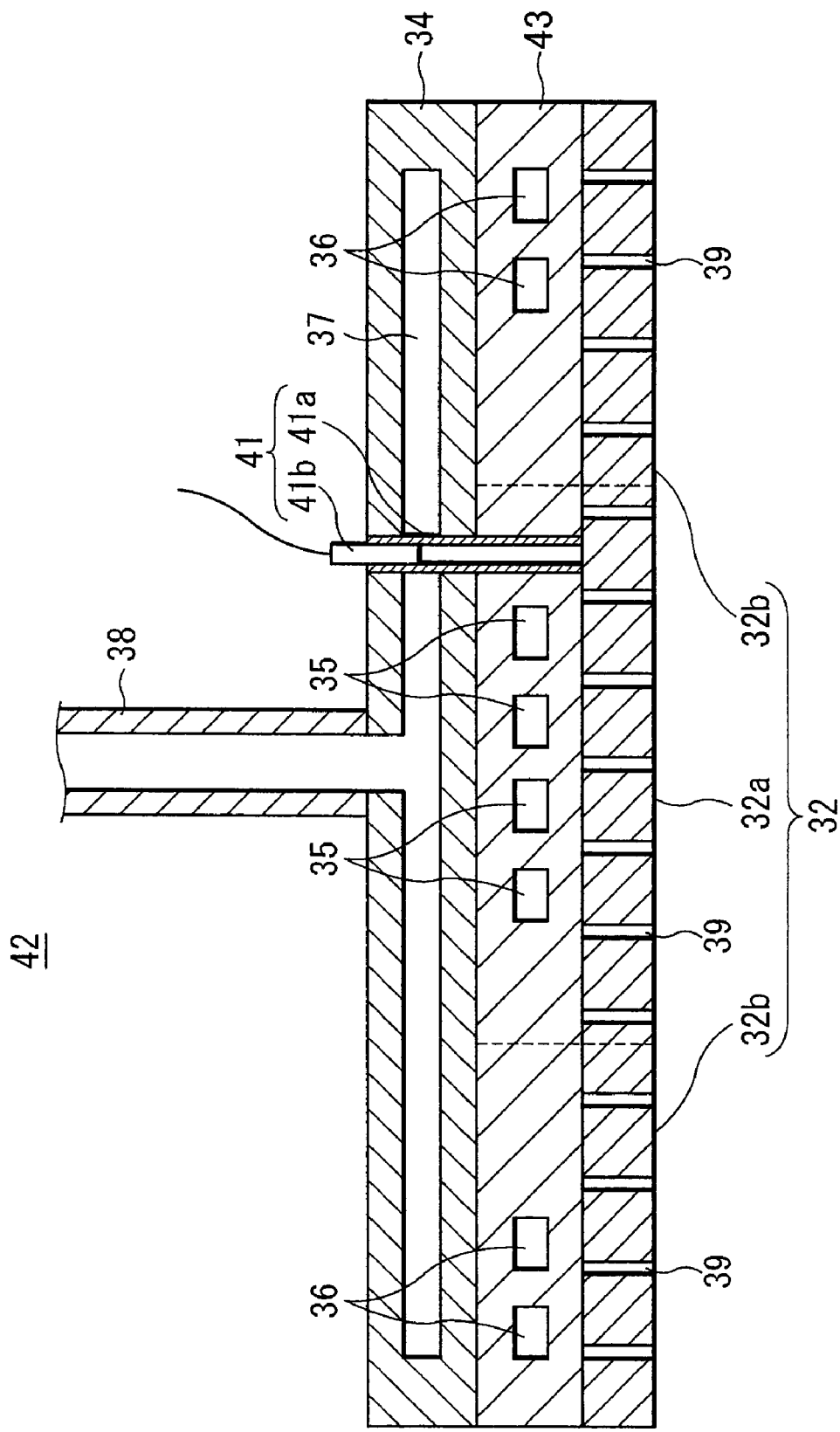

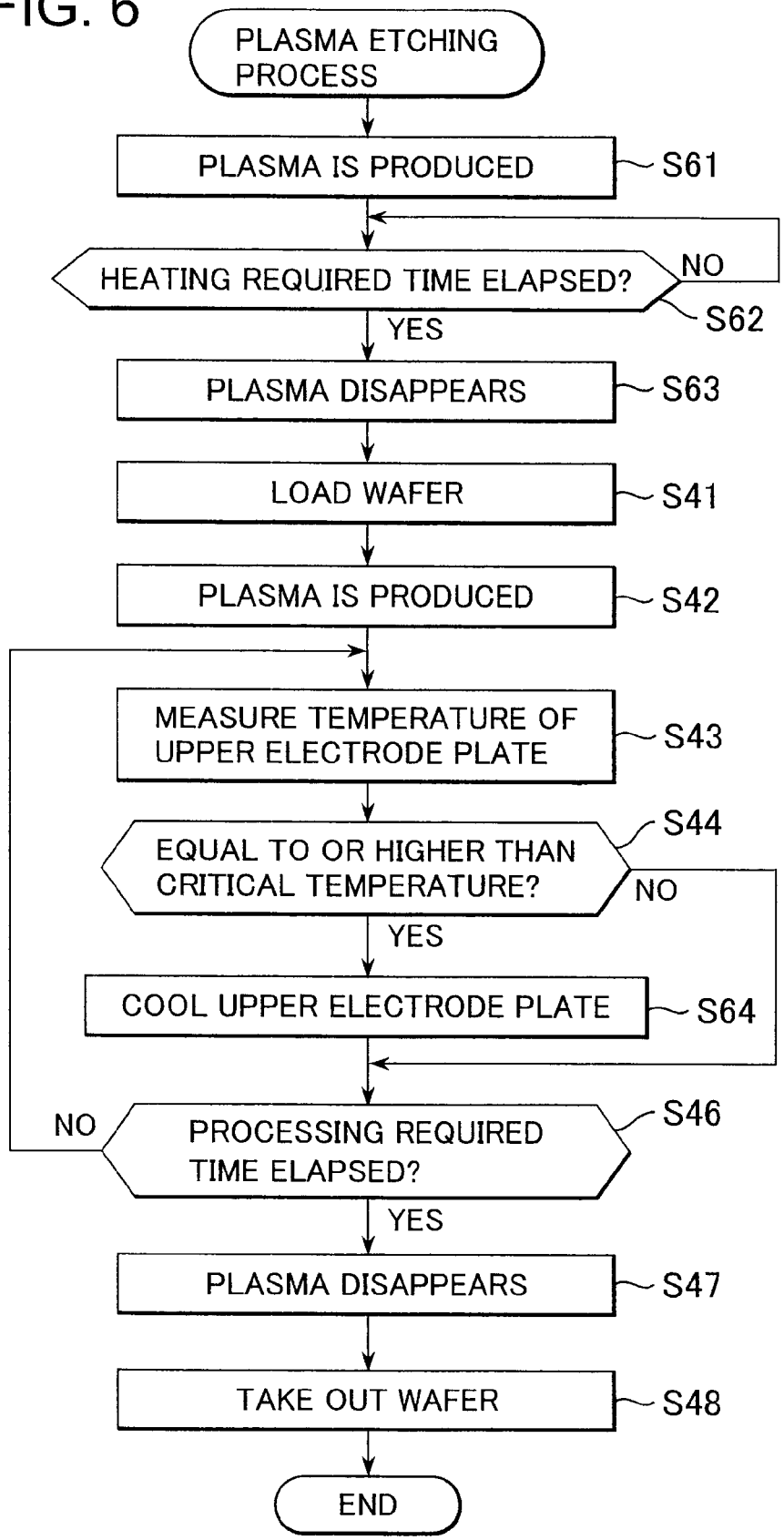

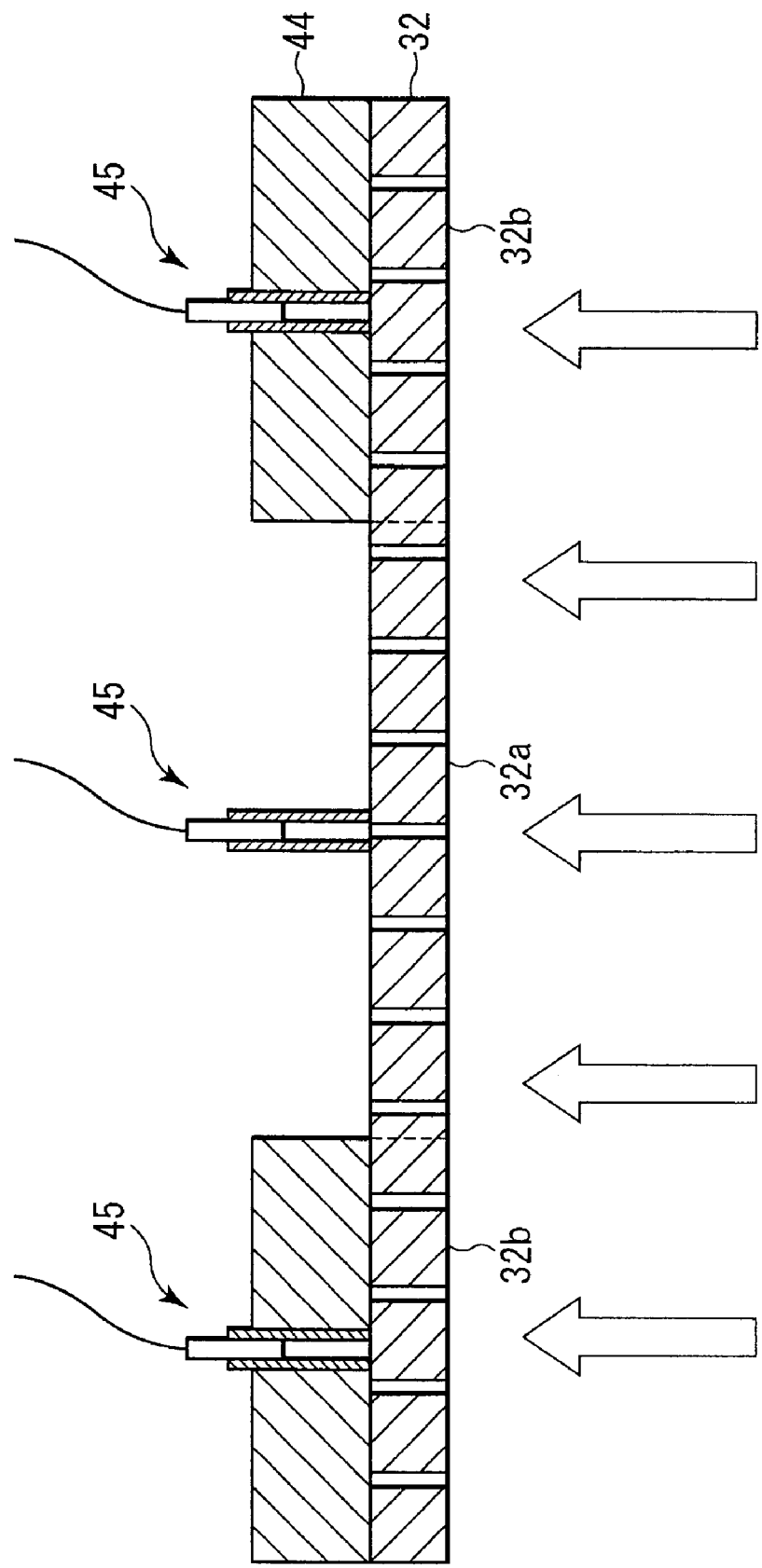

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus, and in particular, to a substrate processing method for a substrate processing apparatus having an upper electrode plate made of silicon.

2. Description of the Related Art

Conventionally, a substrate processing apparatus that subjects a semiconductor wafer (hereinafter referred to merely as a "wafer") as a substrate to plasma processing has a chamber in which a wafer is housed and of which interior is evacuated, and a susceptor that is disposed in a lower part of the chamber and on which the wafer is mounted, and a showerhead that is disposed in an upper part of the chamber and supplies a process gas into the chamber. The showerhead has an upper electrode plate that is disposed in a manner opposed to and parallel to the susceptor.

In the substrate processing apparatus, a radio-frequency power source is connected to the susceptor, and the susceptor thus acts as a lower electrode unit. Also, another radio-frequency power source is connected to the upper electrode plate, and the showerhead thus acts an upper electrode unit. The susceptor and the showerhead produce an electric field in the chamber, whereby the process gas supplied into the chamber is turned into plasma.

In the case where radio-frequency electrical power is applied to the upper electrode plate, if the frequency of the radio-frequency electrical power increases, the effects of inductance of the upper electrode plate on the electric field produced by the upper electrode plate cannot be ignored. As a result, the intensity of the electric field produced from a central portion of the upper electrode plate increases, and the density of plasma in a part facing the central portion of the upper electrode plate increases. That is, there have been problems that, for example, the distribution of plasma in the chamber becomes uneven, and the distribution of etch rates in wafers becomes uneven.

To cope with this, the applicant of the present invention has proposed that a cavity portion is provided in a surface of the central portion of the upper electrode plate opposite to a surface that faces plasma (hereinafter referred to as the "plasma surface"), and resonance is produced in the cavity portion to produce an electric field orthogonal to the upper electrode plate (see, for example, Japanese Laid-Open Patent Publication (Kokai) No. 2001-298015 (FIG. 3)). This makes it possible to bind the electric field in the cavity portion and the electric field in the upper electrode plate together and control the electric field in the central portion of the upper electrode plate, thus eliminating the unevenness in the distribution of plasma in the chamber.

Moreover, in recent years, a higher level of micromachining has been required for etching processing as plasma processing. To realize micromachining, high-density plasma has to be produced, and to achieve this, the frequency of radio-frequency electrical power has to be increased, and/or the electrical energy of radio-frequency electrical power has to be increased so as to keep plasma in a satisfactory dissociated state.

However, although the density of plasma can be increased by increasing the frequency and amount of radio-frequency electrical power, the temperature of the upper electrode plate increases at the same time because ion fluxes irradiated on the upper electrode unit (showerhead) increase.

The showerhead of the conventional substrate processing apparatus has a cooling plate that contacts and cools the upper electrode plate, but the above described cavity portion exists between the central portion of the upper electrode plate and the cooling plate. It is thus difficult to efficiently cool the central portion of the upper electrode plate, and the central portion of the upper electrode plate may be heated to a high temperature only by cooling it without an aim.

On the other hand, the upper electrode plate is made of p-type silicon doped with boron or the like (the initial specific resistance value is about 75Ω·cm), and it is known that the specific resistance value of the p-type silicon changes if it is maintained at a high temperature for a long period of time. In particular, if the central portion of the upper electrode plate made of the p-type silicon is maintained at a high temperature for a long period of time, oxygen mixed as impurities in the p-type silicon acts as donors to supply free electrons to eliminate holes produced by the boron. Thus, if the specific resistance value of the central portion of the upper electrode plate increases and then, the holes are completely eliminated (if the p-type silicon turns into n-type silicon), the specific resistance value decreases. If the specific resistance value of the central portion of the upper electrode plate decreases, the intensity of the electric field produced from the central portion of the upper electrode plate increases to cancel the effect of providing the above-mentioned cavity portion. As a result, the density of plasma in an area facing the central portion of the upper electrode plate increases.

Therefore, only by cooling the central portion of the upper electrode plate without an aim, the distribution of plasma in the chamber cannot be stabilized, and the unevenness in the distribution of plasma cannot be eliminated.

SUMMARY OF THE INVENTION

The present invention provides a substrate processing method and a substrate processing apparatus that can eliminate unevenness in the distribution of plasma.

Accordingly, in a first aspect of the present invention, there is provided a substrate processing method for a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, comprising a plasma processing step of carrying out plasma processing on the substrate, wherein the plasma processing step comprises a temperature measurement step of measuring a temperature of the electrode plate, and a temperature control step of, based on the measured temperature, maintaining the temperature of the electrode plate lower than a critical temperature at which a specific resistance value of the silicon starts changing.

According to the first aspect of the present invention, while the substrate is being subjected to the plasma processing, the temperature of the electrode plate is measured, and based on the measured temperature, the temperature of the electrode plate is maintained lower than the critical temperature at which the specific resistance value of the silicon starts changing. Thus, the temperature of the electrode plate can be reliably prevented from being maintained equal to or higher than the critical temperature. As a result, the specific resistance value of the electrode plate can be reliably prevented from changing, and hence unevenness in the distribution of plasma can be eliminated.

The first aspect of the present invention can provide a substrate processing method, wherein in the temperature measurement step, at least the temperature of a central portion of the electrode plate is measured, and in the temperature control step, at least the temperature of a central portion of the electrode plate is maintained lower than the critical temperature.

According to the first aspect of the present invention, while the substrate is being subjected to the plasma processing, the temperature of at least the central portion of the electrode plate is measured, and the temperature of at least the central portion of the electrode plate is maintained lower than the critical temperature. As a result, the specific resistance value of the central portion of the electrode plate can be prevented from changing, and hence unevenness in the distribution of plasma can be reliably eliminated.

The first aspect of the present invention can provide a substrate processing method, wherein the critical temperature is 300° C.

Accordingly, in a second aspect of the present invention, there is provided a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, and carries out plasma processing on the substrate, comprising a temperature measurement unit that measures a temperature of the electrode plate and a temperature control unit that, based on the measured temperature, maintains the temperature of the electrode plate lower than a critical temperature at which a specific resistance value of the silicon starts changing.

Accordingly, in a third aspect of the present invention, there is provided a substrate processing method for a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, comprising a plasma processing step of carrying out plasma processing on the substrate, wherein the plasma processing step comprises a temperature control step of maintaining a temperature of the electrode plate lower than a critical temperature at which a specific resistance value of the silicon starts changing, and the temperature of a central portion of the electrode plate is maintained at the critical temperature or higher for a predetermined heating required time period or longer after the electrode plate is incorporated into the substrate processing apparatus and before the plasma processing.

According to the third aspect of the present invention, because the temperature of the central portion of the electrode plate is maintained at the critical temperature or higher for the predetermined heating required time period or longer after the electrode plate is incorporated into the substrate processing apparatus and before the plasma processing, the specific resistance value of the central portion of the electrode plate can be made to be higher than that of the peripheral edge of the electrode plate, and the intensity of an electric field produced from the central portion of the electrode plate can be prevented from increasing. Moreover, because the temperature of the electrode plate is maintained lower than the critical temperature while the substrate is being subjected to the plasma processing, the specific resistance value of the central portion of the electrode plate can be prevented from changing, and hence the specific resistance value of the central portion of the electrode plate can be maintained higher than that of the peripheral edge of the electrode plate while the substrate is being subjected to the plasma processing. As a result, unevenness in the distribution of plasma can be reliably eliminated.

The third aspect of the present invention can provide a substrate processing method, wherein in the temperature control step, the temperature of the electrode plate is maintained lower than the critical temperature based on a result of the measurement of the temperature of the electrode plate.

According to the third aspect of the present invention, while the substrate is being subjected to the plasma processing, the temperature of the electrode plate is maintained lower than the critical temperature based on the result of the measurement of the temperature of the electrode plate, and hence the temperature of the electrode plate can be reliably prevented from being maintained equal to or higher than the critical temperature. As a result, the specific resistance value of the electrode plate can be reliably prevented from changing while the substrate is being subjected to the plasma processing.

The third aspect of the present invention can provide a substrate processing method, wherein in the temperature control step, at least the temperature of a central portion of the electrode plate is maintained lower than the critical temperature.

According to the third aspect of the present invention, while the substrate is being subjected to the plasma processing, the temperature of at least the central portion of the electrode plate is maintained lower than the critical temperature. As a result, the specific resistance value of the central portion of the electrode plate can be prevented from changing, and hence unevenness in the distribution of plasma can be reliably eliminated.

The third aspect of the present invention can provide a substrate processing method, wherein the critical temperature is 300° C.

Accordingly, in a fourth aspect of the present invention, there is provided a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, and carries out plasma processing on the substrate, comprising a temperature control unit that maintains a temperature of the electrode plate lower than a critical temperature at which a specific resistance value of the silicon starts changing, wherein the temperature of a central portion of the electrode plate is maintained at the critical temperature or higher for a predetermined heating required time period or longer after the electrode plate is incorporated into the substrate processing apparatus and before the plasma processing.

Accordingly, in a fifth aspect of the present invention, there is provided a substrate processing method for a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, comprising a plasma processing step of carrying cut plasma processing on the substrate, wherein the plasma processing step comprises a temperature control step of maintaining a temperature of the electrode plate lower than a critical temperature at which a specific resistance value of the silicon starts changing, and the temperature of a central portion of the electrode plate is maintained at the critical temperature or higher for a predetermined heating required time period or longer before the electrode plate is incorporated into the substrate processing apparatus.

According to the fifth aspect of the present invention, because the temperature of the central portion of the electrode plate is maintained at the critical temperature or higher for the predetermined heating required time period or longer before the electrode plate is incorporated into the substrate processing apparatus, the specific resistance value of the central portion of the electrode plate can be made to be higher than that of the peripheral edge of the electrode plate, and the intensity of an electric field produced from the central portion of the electrode plate can be prevented from increasing. Moreover, while the substrate is being subjected to the plasma processing, the temperature of the electrode plate is maintained lower than the critical temperature at which the specific resistance value of the silicon starts changing, and hence the specific resistance value of the electrode plate can be prevented from changing. Thus, while the substrate is being subjected to the plasma processing, the specific resistance value of the central portion of the electrode plate can be maintained higher than the specific resistance value of the peripheral edge of the electrode plate. As a result, unevenness in the distribution of plasma can be eliminated.

The fifth aspect of the present invention can provide a substrate processing method, wherein in the temperature control step, the temperature of the electrode plate is maintained lower than the critical temperature based on a result of the measurement of the temperature of the electrode plate.

The fifth aspect of the present invention can provide a substrate processing method, wherein in the temperature control step, at least the temperature of a central portion of the electrode plate is maintained at a lower temperature than the critical temperature.

The fifth aspect of the present invention can provide a substrate processing method, wherein the critical temperature is 300° C.

Accordingly, in a sixth aspect of the present invention, there is provided a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, and carries out plasma processing on the substrate, comprising a temperature control unit that maintains a temperature of the electrode plate lower than a critical temperature at which a specific resistance value of the silicon starts changing, wherein the temperature of a central portion of the electrode plate is maintained at the critical temperature or higher for a predetermined heating required time period or longer before the electrode plate is incorporated into the substrate processing apparatus.

The features and advantages of the invention will become more apparent from the following detailed description taken in conjunction with the accompanying drawings.

BRIEF DESCRIPTION OF THE DRAWINGS

FIG. 5 is a cross-sectional view showing the construction of a showerhead provided in a substrate processing apparatus according to a second embodiment of the present invention;

FIG. 6 is a flow chart of a plasma etching process as a substrate processing method according to the present embodiment; and FIG. 7 is a view useful in explaining a resistance distribution producing method for an upper electrode plate of a showerhead provided in a substrate processing apparatus according to a third embodiment of the present invention.

DETAILED DESCRIPTION OF PREFERRED EMBODIMENTS

The present invention will now be described in detail with reference to the drawings showing preferred embodiments thereof.

First, a description will be given of a substrate processing apparatus according to a first embodiment of the present invention.

Figure 1:
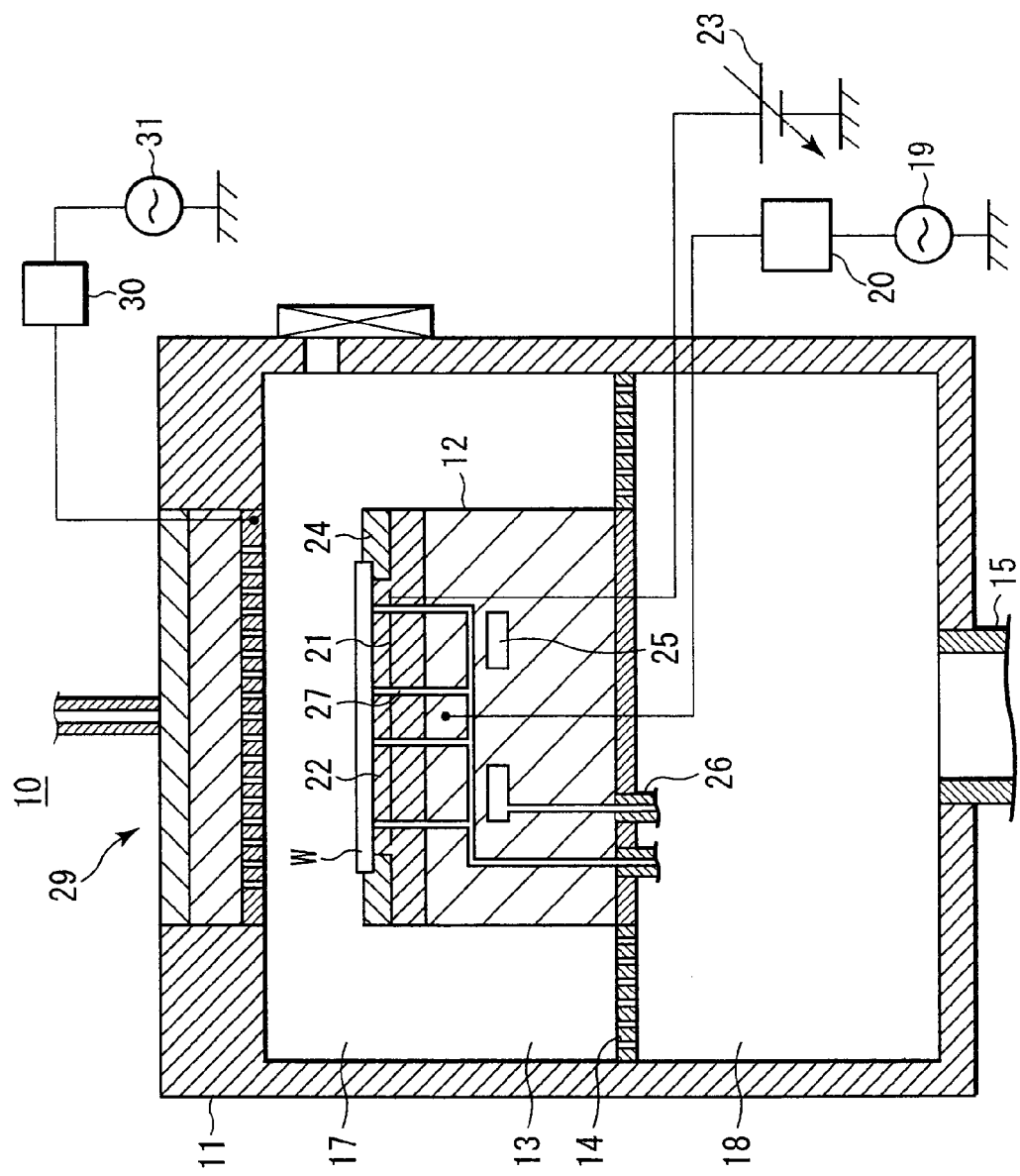
FIG. 1 is a cross-sectional view schematically showing the construction of a substrate processing apparatus according to a first embodiment of the present invention.

FIG. 1 is a cross-sectional view schematically showing the construction of the substrate processing apparatus according to the present embodiment. The substrate processing apparatus is constructed such as to carry out plasma etching processing on a semiconductor wafer as a substrate.

Referring to FIG. 1, the substrate processing apparatus 10 has a chamber 11 (processing chamber) in which a semiconductor wafer (hereinafter referred to merely as a "wafer") W having a diameter of, for example, 300 mm is housed. A cylindrical susceptor 12 (mounting stage) on which the wafer W is mounted is disposed in the chamber 11. In the substrate processing apparatus 10, a side exhaust path 13 that acts as a flow path through which gas above the susceptor 12 is exhausted out of the chamber 11 is formed between an inner side wall of the chamber 11 and the side face of the susceptor 12. An exhaust plate 14 is disposed part way along the side exhaust path 13.

The exhaust plate 14 is a plate-like member having a number of holes therein and functions as a partition plate that partitions the chamber 11 into an upper portion and a lower portion. In the upper portion (hereinafter referred to as the "processing chamber") 17 of the chamber 11 partitioned by the exhaust plate 14, plasma is produced as will be described later. An exhaust pipe 15 exhausting gas inside the chamber 11 is connected to the lower portion (hereinafter referred to as the "exhaust chamber (manifold)") 18 of the chamber 11. The exhaust plate 14 captures or reflects plasma produced in the processing chamber 17 to prevent leakage of the plasma into the manifold 18.

The exhaust pipe 15 has a TMP (turbo-molecular pump) and a DP (dry pump), both of which are not shown, connected thereto. These pumps reduce the pressure in the chamber 11 down to a vacuum state. Specifically, the DP reduces the pressure in the chamber 11 from atmospheric pressure down to an intermediate vacuum state (e.g. a pressure of not more than $1.3 \times 10$ Pa (0.1 Torr)), and the TMP is operated in collaboration with the DP to reduce the pressure in the chamber 11 down to a high vacuum state (e.g. a pressure of not more than $1.3 \times 10^{-5}$ Pa ($1.0 \times 10^{-5}$ Torr)), which is at a lower pressure than the intermediate vacuum state. It should be noted that an APC valve, not shown, controls the pressure in the chamber 11.

A radio-frequency power supply 19 is connected via a lower matcher 20 to the susceptor 12 in the chamber 11 for applying predetermined radio-frequency power to the susceptor 12, whereby the susceptor 12 therefore functions as a lower electrode unit to apply radio-frequency power to the interior of the processing chamber 17. The lower matcher 20 reduces the reflection of radio-frequency power from the susceptor 12, thereby maximizing the efficiency of application of the radio-frequency power to the susceptor 12.

An electrostatic chuck 22 having an electrostatic electrode plate 21 therein is provided in an upper portion of the susceptor 12. The electrostatic chuck 22 is made of ceramic and formed by placing an upper disk-shaped member, which has a smaller diameter than a lower disk-shaped member having a certain diameter, over the lower disk-shaped member. When a wafer W is mounted on the susceptor 12, the wafer W is disposed on the upper surface of the upper disk-shaped member of the electrostatic chuck 22.

Moreover, a DC power source 23 is electrically connected to the electrostatic electrode plate 21 of the electrostatic chuck 22. Upon a positive DC voltage being applied to the electrostatic electrode plate 21, a negative potential is produced on a surface of the wafer W which faces the electrostatic chuck 22 (hereinafter referred to as "the rear surface of the wafer W"). A potential difference thus arises between the electrostatic electrode plate 21 and the rear surface of the wafer W, and hence the wafer W is attracted to and held on the upper disk-shaped member through a Coulomb force or a Johnsen-Rahbek force due to the potential difference.

An annular focus ring 24 is mounted on the electrostatic chuck 22 such as to surround the attracted and held wafer W. The focus ring 24 is made of a conductive member such as silicon, and focuses plasma in the processing chamber 17 toward a front surface of the wafer W, thus improving the efficiency of the plasma etching processing.

An annular coolant chamber 25 that extends, for example, in a circumferential direction of the susceptor 12 is provided inside the susceptor 12. A coolant, for example, cooling water or a Galden (registered trademark) fluid, at a low temperature is circulated through the coolant chamber 25 via a coolant piping 26 from a chiller unit, not shown. The susceptor 12 cooled by the low-temperature coolant cools the wafer W and the focus ring 24 via the electrostatic chuck 22.

A plurality of heat transfer gas supply holes 27 are opened to a portion of the upper surface of the upper disk-shaped member of the electrostatic chuck 22 on which the wafer W is attracted and held (hereinafter referred to as the "attracting surface"). The heat transfer gas supply holes 27 supply helium (He) gas as a heat transfer gas into a gap between the attracting surface and the rear surface of the wafer W. The helium gas supplied into the gap between the attracting surface and the rear surface of the wafer W effectively transfers heat from the wafer W to the electrostatic chuck 22.

A showerhead 29 is disposed in a ceiling portion of the chamber 11 such as to face the susceptor 12. An upper radio-frequency power source 31 is connected to the showerhead 29 via an upper matcher 30 and applies predetermined radio-frequency electrical power to the showerhead 29. The showerhead 29 thus acts as an upper electrode unit that applies radio-frequency electrical power to the interior of the processing chamber 17. It should be noted that the upper matcher 30 has a similar function to the lower matcher 20 described above.

Figure 2:
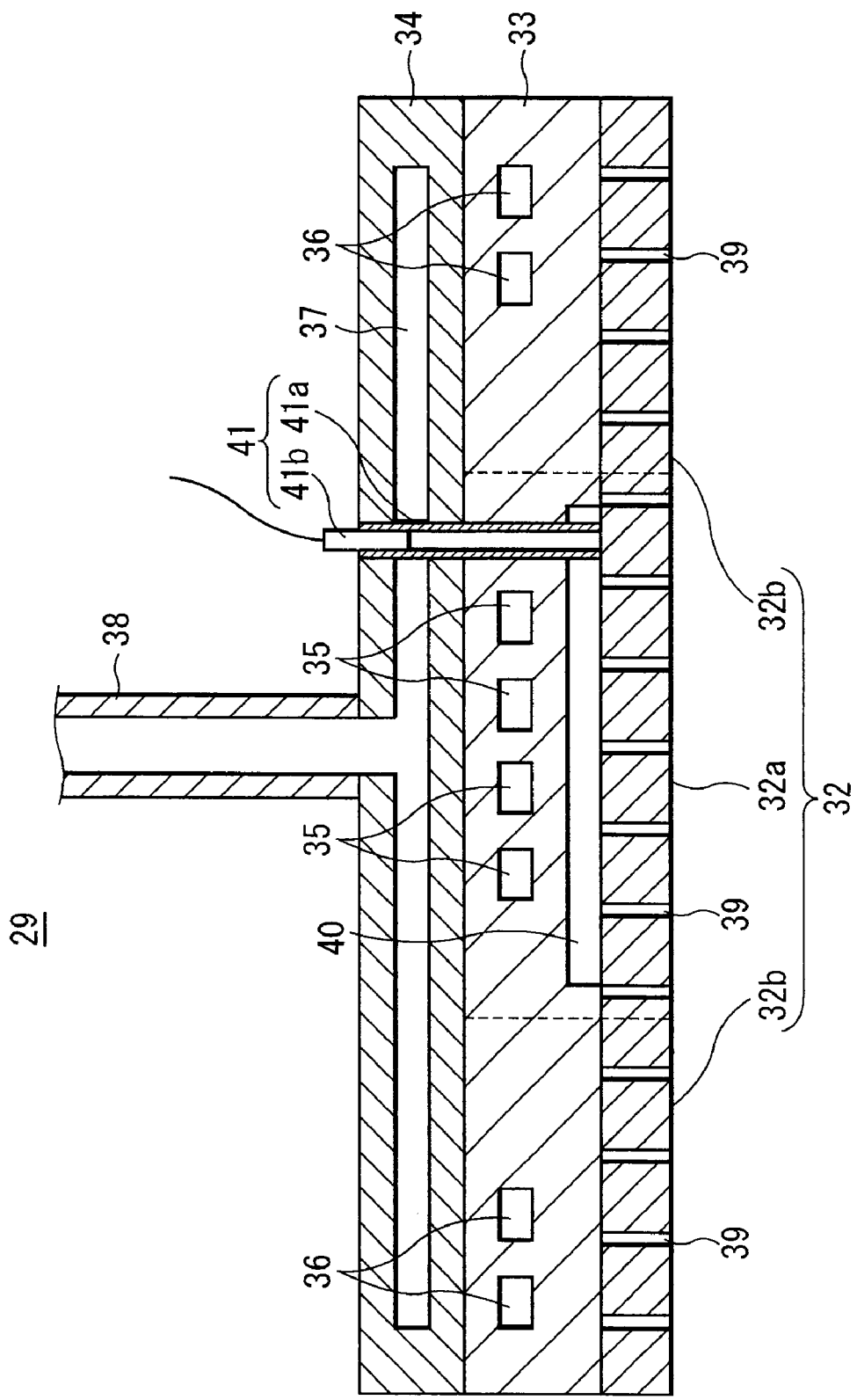
FIG. 2 is an enlarged cross-sectional view showing the construction of a showerhead appearing in FIG. 1.

FIG. 2 is an enlarged cross-sectional view showing the construction of the showerhead appearing in FIG. 1.

Referring to FIG. 2, the showerhead 29 is comprised of a disk-shaped upper electrode plate 32 made of boron-doped silicon, a disk-shaped cooling plate 33 made of aluminum coated with alumite, and an electrode support 34. The upper electrode plate 32 is exposed into the processing chamber 17, and the upper electrode plate 32 and the cooling plate 33 are disposed in this order from the processing chamber 17 side. The upper electrode plate 32 and the cooling plate 33 are suspended by the electrode support 34. In the showerhead 29, the upper radio-frequency power source 31 is connected to the upper electrode plate 32.

The cooling plate 33 has therein a central cooling path 35 and a peripheral edge cooling path 36 through which a cooling medium flows. The central cooling path 35 is disposed such as to face a central portion 32a of the upper electrode plate 32 and cools the central portion 32a, and the peripheral edge cooling path 36 is disposed such as to face a peripheral edge 32b of the upper electrode plate 32 and cools the peripheral edge 32b. Thus, the temperatures of the central portion 32a and the peripheral edge portion 32b of the upper electrode plate 32 are individually controlled.

The electrode support 34 has a buffer chamber 37 therein, and a processing gas introducing pipe 38 is connected to the buffer chamber 37. The buffer chamber 37 communicates with the interior of the processing chamber 17 via a plurality of gas holes, not shown, provided in the cooling plate 33 and a plurality of gas holes 39 provided in the upper electrode plate 32. The showerhead 29 supplies a process gas supplied into the buffer chamber 37 from the processing gas introducing pipe 38 into the processing chamber 17 via the gas holes 39 and the like.

The showerhead 29 also has a cavity portion 40 that is formed by caving in a central portion of the cooling plate 33 in a concave form. The cavity portion 40 lies between the cooling plate 33 and the central portion 32a of the upper electrode plate 32 and produces an electric field orthogonal to the upper electrode plate 32 when radio-frequency electrical power is applied to the upper electrode plate 32.

The showerhead 29 also has a temperature measurement unit 41 that measures the temperature of the upper electrode plate 32, more specifically, the central portion 32a. The temperature measurement unit 41 penetrates the cooling plate 33 and the electrode support 34, and has a pipe-shaped guide 41a that vertically abuts on the upper electrode plate 32, an optical fiber end 41b housed and held in the guide 41a and facing the upper electrode plate 32, and a controller, not shown. The optical fiber end 41b irradiates low-coherence light toward the upper electrode plate 32 and receives reflected light from the upper electrode plate 32. The controller calculates the temperature of the central portion 32a of the upper electrode plate 32 from reflected light received using a low-coherence interferometer, not shown, having the structure of a Michelson interferometer as a basic structure. The temperature measurement unit is not limited to the above described one using the low-coherence interferometer, but may be one using a radiation thermometer that measures the temperature based on infrared rays radiated from the upper electrode plate 32.

In the substrate processing apparatus 10 shown in FIG. 1, radio-frequency electrical power is supplied to the susceptor 12 and the showerhead 29 to apply radio-frequency electrical power to the interior of the processing chamber 17, whereby the process gas supplied from the showerhead 29 is turned into high-density plasma in the processing chamber 17 to perform plasma etching on the wafer W.

Operation of the component parts of the substrate processing apparatus 10 described above is controlled by a CPU of a controller, not shown, provided in the substrate processing apparatus 10.

It is known that, as described above, the specific resistance value of the boron-doped silicon used for the upper electrode plate 32 changes if the temperature of the silicon is maintained at 300° C. (critical temperature) or higher for a long period of time. A description will now be given of this change with reference to FIG. 3.

First, at a time point $T_0$ at which the silicon starts being maintained at 300° C. or higher, in a crystal of the boron-doped silicon, part of silicon atoms replace boron atoms, and the silicon atoms and the boron atoms are electrically bound together via electrons. Because the number of valence electrons in boron is one smaller than the number of valance electrons in silicon, the boron atoms act as acceptors that produce holes, and one boron atom produces one hole between a silicon atom and a boron atom. As a result, in the silicon, the number of holes acting as positive carriers is larger than the number of free electrons, and the silicon acts as p-type silicon, and the specific resistance value thereof becomes low ($R_F\Omega\cdot cm$).

Then, if the silicon continues to be maintained at 300° C. or higher, oxygen atoms mixed as impurities in the silicon and silicon atoms are bound together, so that silicon oxide ($SiO_4$) is formed in the silicon crystal. In the formation of the $SiO_4$, the oxygen atoms act as divalent donors to supply free electrons into the silicon. The supplied free electrons eliminate the holes, and hence the specific resistance value of the silicon increases (times $T_0$ to $T_1$ in FIG. 3).

Thereafter, if the silicon continues to be maintained at 300° C. or higher, the formation of the $SiO_4$ is continuously promoted, and hence free electrons are supplied, and the number of holes and the number of free electrons in the silicon become equal in the end. At this time, all the holes are eliminated by the free electrons. As a result, the silicon exhibits a nonconductive property, and the specific resistance value thereof theoretically reaches an infinite value ($\infty$) (time $T_1$ in FIG. 3).

Then, if the silicon further continues to be maintained at 300° C. or higher, free electrons are continuously supplied, and hence the number of free electrons becomes larger than the number of holes in the silicon, and the free electrons that are not electrically bound by the holes act as negative carriers, and the p-type silicon turns into n-type silicon. Then, the specific resistance value of the silicon finally decreases (times $T_1$ to $T_2$ in FIG. 3) to $R_F\Omega\cdot cm$ lower than $R_F\Omega\cdot cm$, which is the specific resistance value at the time point $T_0$ ($T_2$ in FIG. 3). It should be noted that the above described change in the specific resistance value of the silicon is an irreversible change.

Moreover, the inventors of the present invention ascertained that in the conventional substrate processing apparatus, abnormal discharge occurs in the chamber if the specific resistance value of the central portion of the upper electrode plate made of boron-doped silicon changes because the silicon is maintained at a high temperature. Then, the inventors of the present invention ascertained that in the upper electrode plate in which abnormal discharge has occurred (the integrated time period for which radio-frequency electrical power is applied is 297 hours), p-type silicon turns into n-type silicon, and the specific resistance value decreases to several $\Omega\cdot cm$ on the plasma surface of the central portion. On the other hand, the inventors of the present invention ascertained that in the upper electrode plate in which abnormal discharge has not occurred (the integrated time period for which radio-frequency electrical power is applied is 200 hours), p-type silicon does not turn into n-type silicon, and also, the specific resistance value is about $80\Omega\cdot cm$ on the plasma surface of the central portion.

Accordingly, in the present embodiment, while the wafer W is being subjected to the plasma etching, the temperature of the central portion of the upper electrode 32 is maintained lower than 300° C. at which the specific resistance value of the silicon starts changing (critical temperature).

Figure 4:
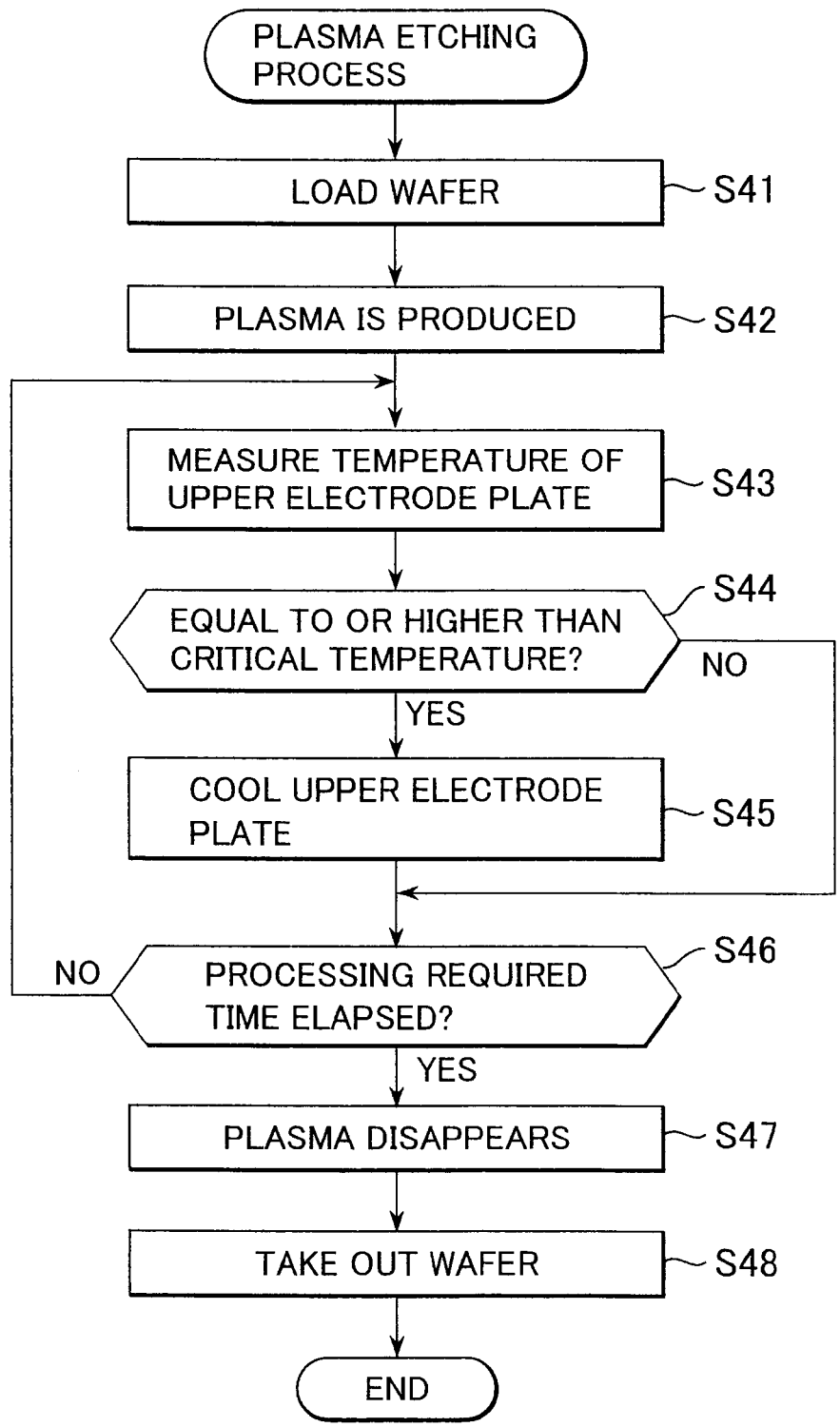
FIG. 4 is a flow chart of a plasma etching process as a substrate processing method according to the present embodiment.

FIG. 4 is a flow chart of a plasma etching process as a substrate processing method executed by the substrate processing apparatus 10 according to the present embodiment.

Referring to FIG. 4, first, a wafer W is transferred into the chamber 11 and mounted on the susceptor 12 (step S41).

Then, a process gas is supplied into the processing chamber 17, and radio-frequency electrical power is applied to the interior of the processing chamber 17, whereby the process gas is turned into high-density plasma (step S42). Then, the wafer W is subjected to the plasma etching process by the plasma (plasma processing step).

Then, while the wafer W is being subjected to the plasma etching process, the temperature measurement unit 41 measures the temperature of the central portion 32a of the upper electrode plate 32 (step S43) (temperature measurement step), and it is determined whether or not the temperature of the central portion 32a is equal to or higher than a critical temperature (300° C.) (step S44).

If, as a result of the determination in the step S44, the temperature of the central portion 32a is equal to or higher than the critical temperature, the flow rate of a cooling medium flowing through the central portion cooling path 35 is increased, and/or the temperature of the cooling medium is decreased to more effectively cool the central portion 32a (step S45), so that the temperature of the central portion 32a is maintained at a lower temperature than the critical temperature (temperature control step), and on the other hand, if the temperature of the central portion 32a is lower than the critical temperature, the process directly proceeds to a step S46.

In the step S46, it is determined whether or not the time period for which the wafer W was subjected to the plasma etching process has exceeded a processing required time determined in advance, and if the time period for which the wafer W was subjected to the plasma etching process has not exceeded the processing required time, the process returns to the step S43, and if the time period for which the wafer W was subjected to the plasma etching process has exceeded the processing required time, the process proceeds to a step S47, in which the application of the radio-frequency electrical power to the interior of the processing chamber 17 is stopped to cause the plasma to disappear, whereupon the plasma etching process comes to an end.

Then, the wafer W that has been subjected to the plasma etching process is transferred out from the chamber 11 (step S48), whereupon the present process comes to an end.

According to the process in FIG. 4, while the wafer W is being subjected to the plasma etching process, the temperature of the central portion 32a of the upper electrode plate 32 is measured, and the temperature of the central portion 32a is maintained lower than the critical temperature (300° C.) based on the measured temperature, and therefore, the temperature of the central portion 32a of the upper electrode plate 32 can be reliably prevented from being maintained equal to or higher than the critical temperature. As a result, the specific resistance value of the central portion 32a of the upper electrode plate 32 can be reliably prevented from changing, and thus, the unevenness in the distribution of plasma generated in the processing chamber 17 can be eliminated, and the occurrence of abnormal discharge in the processing chamber 17 can also be prevented.

Although in the process in FIG. 4 described above, the central portion 32a of the upper electrode plate 32 is positively cooled, not only the central portion 32a but also the peripheral edge 32b of the upper electrode plate 32 may be positively cooled by increasing the flow rate of not only the cooling medium flowing through the central portion cooling path 35 but also a cooling medium flowing through the peripheral edge cooling path 36, and/or by lowering the temperature of the cooling medium.

Moreover, although in the process in FIG. 4 described above, the temperature of the central portion 32a of the upper electrode plate 32 is measured during the plasma etching process, the specific resistance value of the central portion 32a may be measured using a specific resistance meter or the like. In this case, when the specific resistance value of the central portion 32a starts changing, the central portion 32a may be positively cooled. This can prevent the specific resistance value of the central portion 32a from changing.

Further, although in the substrate processing apparatus 10 described above, because the cooling plate 33 is not closely attached to the upper electrode plate 32 but is only overlaid on the upper electrode plate 32, the efficiency of heat transfer from the upper electrode plate 32 to the cooling plate 33 is low, but the cooling plate 33 may be provided with an electrostatic chuck, and the upper electrode plate 32 may be attracted to the cooling plate 33. This can improve the efficiency of heat transfer. Moreover, a heat transfer gas may be supplied to or a heat transfer sheet may be disposed in a minute gap between the cooling plate 33 and the upper electrode plate 32, and this can also improve the efficiency of heat transfer.

Next, a description will be given of a substrate processing apparatus according to a second embodiment of the present invention.

In the conventional substrate processing apparatus and the substrate processing apparatus 10 in FIG. 1, the showerhead (29) has the cavity portion (40) so that an electric field orthogonal to the upper electrode plate (32) can be produced. However, the cavity portion decreases the cooling efficiency of the central portion because the cavity portion exists between the central portion of the upper electrode plate and the cooling plate as described above. Moreover, because the cavity portion is a local space on the side of the upper electrode plate to which radio-frequency electrical power is applied, abnormal discharge is likely to occur.

On the other hand, in the present embodiment, a showerhead is provided with no cavity portion. It should be noted that the present embodiment is basically the same as the first embodiment described above in terms of construction and operation except for the construction of the showerhead, and features of the construction and operation that are the same as in the first embodiment will thus not be described, only features that are different from those of the first embodiment being described below.

FIG. 5 is a cross-sectional view showing the construction of the showerhead provided in the substrate processing apparatus according to the present embodiment.

Referring to FIG. 5, the showerhead 42 is comprised of the disk-shaped upper electrode plate 32, a disk-shaped cooling plate 43 made of aluminum coated with alumite, and the electrode support 34. A central portion of the cooling plate 43 is not caved in a concave form, and hence in the showerhead 42, there is no cavity portion between the cooling plate 43 and the central portion 32a of the upper electrode plate 32.

Moreover, as is the case with the first embodiment, the upper electrode plate 32 is made of boron-doped silicon, but if the substrate processing apparatus 10 has never carried out plasma etching on a wafer W after the assembly of the substrate processing apparatus 10 or after the replacement of the upper electrode plate 32 (that is, after the upper electrode plate 32 is incorporated into the substrate processing apparatus 10), all the silicon constituting the upper electrode plate 32 is p-type silicon, and the specific resistance values of both the central portion 32a and the peripheral edge 32b of the upper electrode plate 32 are low and equal.

If the specific resistance value of the central portion 32a of the upper electrode plate 32 is equal to or lower than the specific resistance value of the peripheral edge 32b of the upper electrode plate 32, the intensity of an electric field produced from the central portion 32a increases, and as a result, the density of plasma in a part of the processing chamber 17 which faces the central portion 32a increases. To cope with this, in the present embodiment, before the wafer W is subjected to the plasma etching, the specific resistance value of the central portion 32a of the upper electrode plate 32 is made to be higher than the specific resistance value of the peripheral edge 32b of the upper electrode plate 32.

FIG. 6 is a flow chart of a plasma etching process as a substrate processing method executed by the substrate processing apparatus according to the present embodiment.

Referring to FIG. 6, after the upper electrode plate 32 is incorporated into the substrate processing apparatus 10, first, a process gas is supplied to the interior of the processing chamber 17 without transferring the wafer W into the chamber 11, and radio-frequency electrical power is applied to the interior of the processing chamber 17, whereby the process gas is turned into high-density plasma (step S61). When the high-density plasma is produced, ion fluxes irradiated on the upper electrode plate 32 at the same time increase, and hence the temperature of the upper electrode plate 32 increases. At this time, because the specific resistance values of both the central portion 32a and the peripheral edge 32b of the upper electrode plate 32 are equal, the density of plasma in a part facing the central portion 32a increases, and the number of ion fluxes irradiated on the central portion 32a becomes larger than that of ion fluxes irradiated on the peripheral edge 32b. Thus, the temperature of the central portion 32a becomes higher than that of the peripheral edge 32b and becomes equal to or higher than the critical temperature in the end. Thereafter, insofar as the ion fluxes are irradiated on the upper electrode plate 32, the temperature of the central portion 32a is maintained equal to or higher than the critical temperature.

Then, it is determined whether or not a heating required time determined in advance has elapsed from a time point at which the temperature of the central portion 32a had exceeded the critical temperature (step S62), and if the heating required time has not elapsed, the process returns to the step S62, and if the heating required time has elapsed, the process proceeds to a step S63, in which the application of the radio-frequency electrical power to the interior of the processing chamber 17 is stopped to cause the plasma to disappear.

Figure 3:
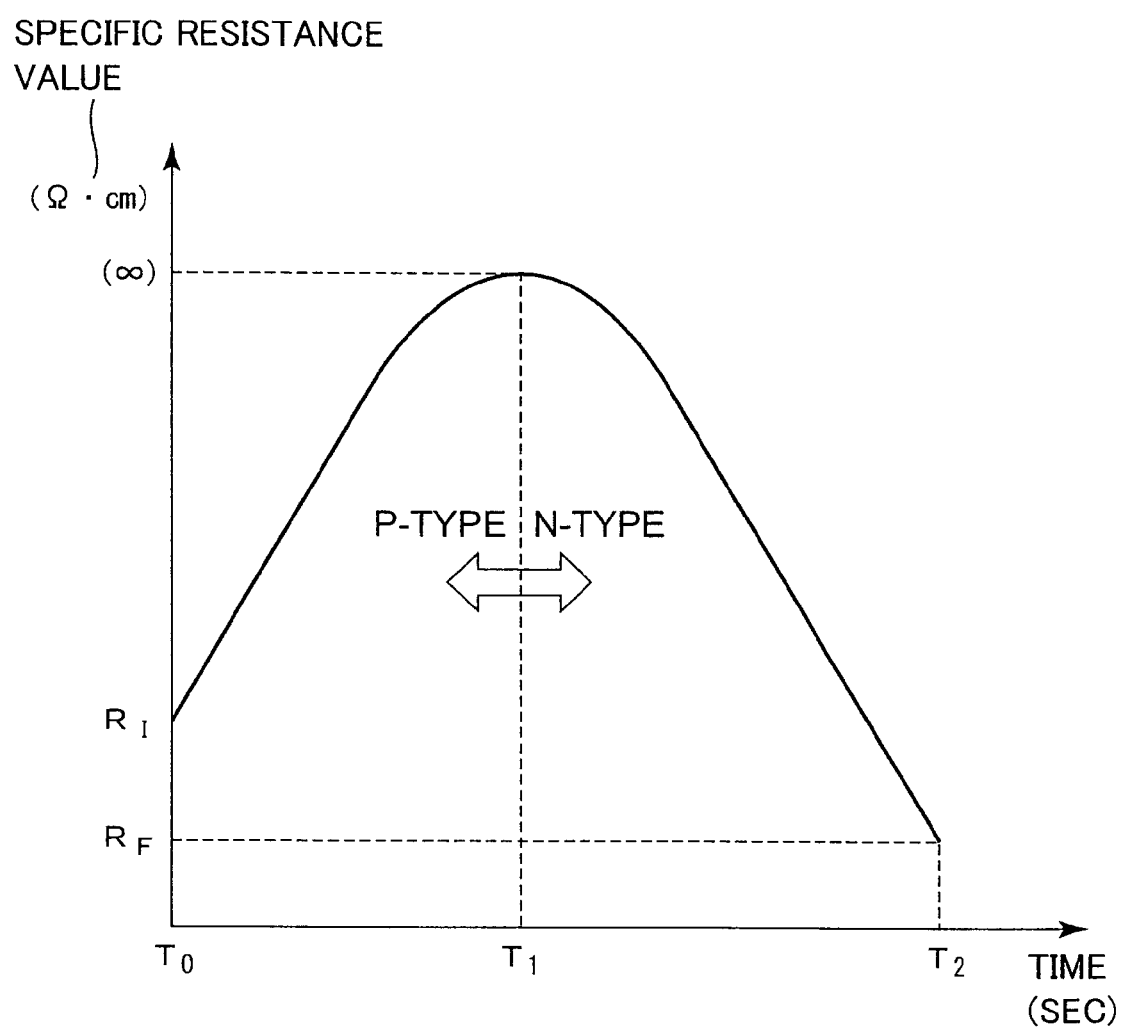
FIG. 3 is a graph showing changes in the specific resistance value of boron-doped silicon in the case where the silicon is maintained at high temperature.

The specific resistance value of the central portion 32a whose temperature has become equal to or higher than the critical temperature increases with the passage of time (see FIG. 3). Here, the heating required time in the present embodiment is a time period required for the specific resistance value of the central portion 32a to become sufficiently higher than the specific resistance value of the peripheral edge 32b and a time period before the specific resistance value of the central portion 32a starts decreasing. Thus, the specific resistance value of the central portion 32a is sufficiently higher than that of the peripheral edge 32b in the step S62 and the subsequent steps.

Then, the steps S41 to S44 are executed, and if, as a result of the determination in the step S44, the temperature of the central portion 32a is equal to or higher than the critical temperature, the flow rate of a cooling medium flowing through the central portion cooling path 35 and the peripheral edge cooling path 36 is increased, and/or the temperature of the cooling medium is decreased to more effectively cool the entire upper electrode plate 32 (step S64), so that the temperature of the entire upper electrode plate 32 is maintained lower than the critical temperature (temperature control step). Thus, in the upper electrode plate 32, the specific resistance value of the central portion 32a is maintained sufficiently higher than that of the peripheral edge 32b.

If, as a result of the determination in the step S44, the temperature of the central portion 32a is lower than the critical temperature, the process directly proceeds to the step S46.

Then, the steps S46 to S48 are executed, whereupon the process comes to an end.

According to the process in FIG. 6, because the temperature of the central portion 32a of the upper electrode plate 32 is maintained equal to or higher than the critical temperature for the heating required time period or longer after the upper electrode plate 32 is incorporated into the substrate processing apparatus 10 and before the plasma etching process, the specific resistance value of the central portion 32a can be made to be sufficiently higher than that of the peripheral edge 32b, and the intensity of the electric field produced from the central portion 32a of the upper electrode plate 32 can be prevented from increasing while the wafer W is being subjected to the plasma etching process. Moreover, because the temperature of the entire upper electrode plate 32 is maintained lower than the critical temperature while the wafer W is being subjected to the plasma etching process, the specific resistance value of the entire upper electrode plate 32 can be prevented from changing, and thus, the specific resistance value of the central portion 32a of the upper electrode plate 32 can be maintained sufficiently higher than that of the peripheral edge 32b of the upper electrode plate 32. As a result, the unevenness in the distribution of plasma can be eliminated. Moreover, because there is no need to provide a cavity portion in the showerhead 42, the occurrence of abnormal discharge can be prevented.

Further, in the step S61 of the above described process in FIG. 6, the flow rate of the cooling medium flowing through the central cooling path 35 may be lowered, and/or the temperature of the cooling medium may be increased. This can promote changes in the specific resistance value of the central portion 32a of the upper electrode plate 32, so that the heating required time can be shortened.

It should be noted that if, at least on the plasma surface, the specific resistance value of the central portion 32a of the upper electrode plate 32 is higher than that of the peripheral edge 32b of the upper electrode plate 32, the intensity of the electric field produced from the central portion 32a can be prevented from increasing, and hence the specific resistance value on the surface of the central portion 32a opposite to the plasma surface does not have to be higher than the specific value of the surface of the peripheral edge 32b opposite to the plasma surface.

Next, a description will be given of a substrate processing apparatus according to a third embodiment of the present invention.

The present embodiment is basically the same as the second embodiment described above in terms of construction and operation. Features of the construction and operation that are the same as in the first embodiment will thus not be described, only features that are different from those of the first embodiment being described below.

The construction of a showerhead provided in the substrate processing apparatus according to the present embodiment is the same as the construction of the showerhead 42 of the second embodiment, differing from the second embodiment in that the specific resistance value of the central portion 32a of the upper electrode plate 32 is set to be sufficiently higher than that of the peripheral edge 32b of the upper electrode plate 32 (the distribution of resistances arises) before the substrate processing apparatus 10 is assembled or before the upper electrode plate 32 is replaced (that is, before the upper electrode plate 32 is incorporated into the substrate processing apparatus 10).

FIG. 7 is a view useful in explaining a resistance distribution producing method for the upper electrode plate of the showerhead provided in the substrate processing apparatus according to the present embodiment.

Referring to FIG. 7, heat is radiated toward the plasma surface of the upper electrode plate 32 by a radiation heater or the like before the upper electrode plate 32 is incorporated into the substrate processing apparatus 10. On the other hand, an annular heat extractor 44 abuts on the surface of the upper electrode plate 32 opposite to the plasma surface such as to cover the peripheral edge 32b. The heat extractor 44 absorbs thermal energy of the upper electrode plate 32. This can cause a temperature difference to arise between the central portion 32a and the peripheral edge 32b of the upper electrode plate 32. As a result, the temperature of the central portion 32a becomes higher than that of the peripheral edge 32b and becomes equal to or higher than the critical temperature in the end.

After that, heat is continuously radiated toward the plasma surface of the upper electrode plate 32, and hence the specific resistance value of the central portion 32a increases with the passage of time (see FIG. 3), but after a heating required time period determined in advance has elapsed from a time point at which the temperature of the central portion 32a exceeds the critical temperature, the radiation of heat toward the plasma surface is stopped. As a result, the upper electrode plate 32 of which central portion 32a has a sufficiently higher specific resistance value than the peripheral edge 32b can be obtained.

It should be noted that the present embodiment differs from the second embodiment in the method of heating the upper electrode plate 32, and hence the heating required time in the present embodiment may differ from the heating required time in the second embodiment.

Moreover, in the resistance distribution producing method in FIG. 7, to reliably cause a temperature difference to arise between the central portion 32a and the peripheral edge 32b of the upper electrode plate 32, the temperatures of the central portion 32a and the peripheral edge 32b are measured by a temperature measurement unit 45 having the same construction as the constructing of the above described temperature measurement unit 41, and the amount of heat radiated toward the central portion 32a and the peripheral edge 32b is adjusted based on the measured temperatures of the central portion 32a and the peripheral edge 32b.

After the upper electrode plate 32 obtained by the resistance distribution producing method in FIG. 7 is incorporated into the substrate processing apparatus 10, the substrate processing apparatus 10 carries out a plasma etching process as a substrate processing method according to the present embodiment on a wafer W. The plasma etching process is basically the same as the plasma etching process in FIG. 4, differing in that while the wafer W is being subjected to the plasma etching process, not only the central portion 32a but also the peripheral edge 32b are efficiently cooled to maintain the temperature of the entire upper electrode plate 32 lower than the critical temperature. Therefore, in the present embodiment as well, while the wafer W is being subjected to the plasma etching process, the specific resistance value of the central portion 32a of the upper electrode plate 32 is maintained sufficiently higher than the specific resistance value of the peripheral edge 32b of the upper electrode plate 32.

According to the plasma etching process of the present embodiment, because the temperature of the central portion 32a of the upper electrode plate 32 is maintained equal to or higher than the critical temperature for the heating required time period or longer before the upper electrode plate 32 is incorporated into the substrate processing apparatus 10, the specific resistance value of the central portion 32a can be made to be sufficiently higher than the specific resistance value of the peripheral edge 32b. Moreover, because the temperature of the entire upper electrode plate 32 is maintained lower than the critical temperature while the wafer W is being subjected to the plasma etching process, the specific resistance value of the central portion 32a of the upper electrode plate 32 is maintained sufficiently higher than the specific resistance value of the peripheral edge 32b of the upper electrode plate 32.

Although in the above described embodiments, the substrates subjected to the plasma etching processing are semiconductor wafers, the substrate are not limited to them and rather may instead be any of various glass substrates used in LCDs (Liquid Crystal Displays), FPDs (Flat Panel Displays), or the like.

It is to be understood that the object of the present invention may also be accomplished by supplying a computer with a storage medium in which a program code of software, which realizes the functions of any of the above described embodiments is stored, and causing a CPU of the computer to read out and execute the program code stored in the storage medium.

In this case, the program code itself read from the storage medium realizes the functions of any of the above described embodiments, and hence the program code and the storage medium on which the program code is stored constitute the present invention.

Examples of the storage medium for supplying the program code include a medium capable of storing the above program code, for example, a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be supplied by downloading from another computer, a database, or the like, not shown, connected to the Internet, a commercial network, a local area network, or the like.

Further, it is to be understood that the functions of any of the above described embodiments may be accomplished not only by executing a program code read out by a computer, but also by causing an OS (an operating system) or the like which operates on a CPU to perform a part or all of the actual operations based on instructions of the program code.

Further, it is to be understood that the functions of any of the above described embodiments may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program code executed by an interpreter, or a script data supplied to an OS.

What is claimed is:

1. A substrate processing method for a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, comprising:

a plasma processing step of carrying out plasma processing on the substrate, wherein said plasma processing step comprises a temperature measurement step of measuring a temperature of the electrode plate, and a temperature control step of, based on the measured temperature, separately controlling a temperature of a central portion and that of a peripheral edge of the electrode plate so as to maintain the temperature of the central portion of the electrode plate lower than a critical temperature at which a specific resistance value of the silicon starts changing.

2. A substrate processing method as claimed in claim 1, wherein the critical temperature is 300° C.

3. A substrate processing method for a substrate processing apparatus that has a processing chamber in which a substrate is housed, a mounting stage that is disposed in the processing chamber and on which the substrate is mounted, and an electrode plate that is disposed in the processing chamber such as to face the mounting stage, the electrode plate being made of silicon and connected to a radio-frequency power source, comprising:

a plasma processing step of carrying out plasma processing on the substrate, wherein said plasma processing step comprises a temperature control step of maintaining a temperature of the electrode plate lower than a critical temperature at which a specific resistance value of the silicon starts changing, and a temperature of a central portion and that of a peripheral edge of the electrode plate are separately controlled so as to maintain the temperature of the central portion of the electrode plate at the critical temperature or higher for a predetermined heating required time period or longer after the electrode plate is incorporated into the substrate processing apparatus and before the plasma processing.

4. A substrate processing method as claimed in claim 3, wherein in said temperature control step, the temperature of the electrode plate is maintained lower than the critical temperature based on a result of the measurement of the temperature of the electrode plate.

5. A substrate processing method as claimed in claim 3, wherein in said temperature control step, at least the temperature of a central portion of the electrode plate is maintained lower than the critical temperature.

6. A substrate processing method as claimed in claim 3, wherein the critical temperature is 300° C.

7. A substrate processing method as claimed in claim 1, wherein the electrode plate is an upper electrode.

8. A substrate processing method as claimed in claim 1, wherein an electrostatic chuck is provided between the electrode plate and a cooling plate so as to attract the electrode plate to the cooling plate.

9. A substrate processing method as claimed in claim 3, wherein the electrode plate is an upper electrode.

10. A substrate processing method as claimed in claim 1, wherein electrode plate includes boron-doped silicon.

11. A substrate processing method as claimed in claim 1, wherein the separately controlling the temperature includes controlling at least one of a flow rate of a cooling medium or a temperature of the cooling medium that flows through a channel disposed above the central portion of the electrode plate.

12. A substrate processing method as claimed in claim 1, wherein a specific resistance value of the central portion of the electrode plate is higher than a specific resistance value of the peripheral edge of the electrode plate.

13. A substrate processing method as claimed in claim 1, wherein the measuring the temperature of the electrode plate includes measuring the temperature of the electrode plate disposed in a showerhead of the substrate processing apparatus.

* * * * *